US012721498B2

(12) United States Patent
Magan

(10) Patent No.: US 12,721,498 B2
(45) Date of Patent: Sep. 1, 2026

(54) DOORMAT ALERTING DEVICE

(71) Applicant: Sabestian Magan, Columbus, OH (US)

(72) Inventor: Sabestian Magan, Columbus, OH (US)

( * ) Notice: Subject to any disclaimer, the term of this patent is extended or adjusted under 35 U.S.C. 154(b) by 310 days.

(21) Appl. No.: 18/179,481

(22) Filed: Mar. 7, 2023

(65) Prior Publication Data

US 2023/0346195 A1 Nov. 2, 2023

Related U.S. Application Data

(60) Provisional application No. 63/335,975, filed on Apr. 28, 2022.

(51) Int. Cl.

| | |
|---|---|
| ***G01L 5/22*** | (2006.01) |
| ***A47L 23/26*** | (2006.01) |
| ***G01S 17/08*** | (2006.01) |
| ***G08C 17/02*** | (2006.01) |
| ***H05K 5/02*** | (2006.01) |

(52) U.S. Cl.
CPC ................ *A47L 23/26* (2013.01); *G01L 5/22* (2013.01); *G01S 17/08* (2013.01); *G08C 17/02* (2013.01); *H05K 5/0278* (2013.01)

(58) Field of Classification Search
CPC ........................................................ G01L 1/205
See application file for complete search history.

(56) References Cited

U.S. PATENT DOCUMENTS 4,551,713 A 11/1985 Aossey
4,924,214 A 5/1990 Hill
5,210,528 A 5/1993 Schulman
6,087,926 A * 7/2000 Hajianpour .............. A43B 3/34 340/665
6,144,306 A 11/2000 Huang
6,876,306 B2 * 4/2005 Nelson ................... G08B 13/10 340/666
6,888,081 B2 * 5/2005 Friedrich ............... H01H 3/141 200/86 R
7,382,267 B2 * 6/2008 Brendley ............... G08B 13/10 340/541
7,504,938 B2 * 3/2009 Eiza ......................... H04B 3/54 340/666
7,714,728 B2 * 5/2010 Koblasz ............... A61B 5/6807 340/286.07
7,999,690 B1 8/2011 Shilts
8,444,294 B1 * 5/2013 Hawkins ............... A47L 23/266 362/249.05

(Continued)

*Primary Examiner* — Tran M. Tran
(74) *Attorney, Agent, or Firm* — Brennan, Manna & Diamond, LLC

(57) ABSTRACT

A doormat device that alerts a user when an individual is at their door and/or approaching their door. In one embodiment, the device is comprised of a pressure sensor that is activated when an individual steps on the device. In this embodiment, when the pressure sensor is activated, the transmitter of the device may communicate with a smart doorbell or other smart device to alert the user of the presence of an individual at their door. A second embodiment of the device is comprised of a proximity sensor that detects an individual approaching a door. Once the proximity sensor is activated, the transmitter of the device may communicate with a smart doorbell or other smart device to alert the user of the presence of an individual at their door.

5 Claims, 2 Drawing Sheets

(56) References Cited

U.S. PATENT DOCUMENTS 8,471,719 B2 * 6/2013 Hu ..................... H03K 17/9625
340/657
8,760,839 B1 * 6/2014 Mathis .................. A47L 23/266
361/232
9,030,832 B2 * 5/2015 Kwong ................. G01J 1/0488
361/752
9,115,849 B2 * 8/2015 Ido ........................... F16P 3/12
9,129,513 B1 9/2015 Clarke
9,212,814 B2 * 12/2015 Puljan ................ A47G 27/0225
9,619,987 B2 * 4/2017 Desgorces ......... G08B 21/0438
9,668,328 B2 * 5/2017 Brar ....................... G08C 17/02
9,691,240 B2 * 6/2017 Bradford ................ G08B 13/10
9,743,013 B1 * 8/2017 Merrill ............. G08B 13/19641
9,792,789 B2 * 10/2017 Wu ........................ G08B 13/10
9,799,183 B2 * 10/2017 Harrison .............. G08B 13/248
10,333,370 B2 * 6/2019 Webster ............... H02K 7/1853
10,490,052 B2 * 11/2019 Hsu ....................... A61B 5/1117
10,582,831 B2 * 3/2020 McKeown .............. G09F 19/22
10,588,545 B2 * 3/2020 Di Croce .............. A61B 5/1117
10,614,299 B2 * 4/2020 Zhang .................... G01H 17/00
10,650,668 B2 * 5/2020 Sayavong ............. G06F 16/951
10,706,702 B2 * 7/2020 Scalisi ............. G08B 13/19684
10,977,908 B2 * 4/2021 Philippi ................... G08B 3/06
11,030,868 B2 * 6/2021 Buttolo ................... G01S 19/14
11,063,415 B2 * 7/2021 Raymond ......... E04F 15/02452
11,083,652 B2 * 8/2021 Bogie .................... A61G 5/128
11,361,641 B2 * 6/2022 Scalisi ............. G08B 13/19695
11,432,671 B2 * 9/2022 Abdulrahman ........... G06F 3/14
11,482,087 B1 * 10/2022 Philippi ................. G08B 21/02
11,561,123 B2 * 1/2023 Serval .................... G01G 19/50
11,561,126 B2 * 1/2023 Kovacs .................. A61B 5/333
11,816,999 B2 * 11/2023 Tazume .................. B64C 13/18
11,871,155 B2 * 1/2024 Scalisi ..................... G07C 9/37
11,889,009 B2 * 1/2024 Scalisi ................... H04N 7/188
11,953,881 B2 * 4/2024 Prugh .................... G01G 19/44
11,969,113 B2 * 4/2024 Pappas .................. A47L 23/263
12,118,865 B2 * 10/2024 Scalisi ..................... G08B 3/10
2005/0040954 A1 * 2/2005 McNally ................ A01K 1/035
340/573.3
2007/0171058 A1 * 7/2007 Knowles ................ G08B 13/10
340/687
2009/0195393 A1 * 8/2009 Tegeler ................ A01K 15/021
340/573.3
2015/0347081 A1 * 12/2015 Curcio ..................... G08B 3/10
340/4.4
2016/0070356 A1 * 3/2016 Aguirre ................... G06F 3/017
345/156
2017/0196195 A1 * 7/2017 Wisdom ................. A01K 29/00
2018/0164167 A1 * 6/2018 Wilkinson ................ G01L 1/16
2022/0415150 A1 * 12/2022 Brooksby ............. F41A 17/063
2023/0025954 A1 * 1/2023 Brown ..................... G08B 3/10
2023/0082292 A1 * 3/2023 Serval .................... G01G 17/08
177/1

* cited by examiner

DOORMAT ALERTING DEVICE

CROSS-REFERENCE TO RELATED APPLICATION

The present application claims priority to, and the benefit of, U.S. Provisional Application No. 63/335,975, which was filed on Apr. 28, 2022, and is incorporated herein by reference in its entirety.

FIELD OF THE INVENTION

The present invention relates generally to the field of doormats. More specifically, the present invention relates to a doormat device that alerts a user when an individual is at their door and/or approaching their door. In one embodiment, the device is comprised of a pressure sensor that is activated when a user steps on the device and communicates with a smart doorbell or other smart device to alert the user of the presence of an individual at their door. A second embodiment of the device is comprised of a proximity sensor that detects an individual approaching a door that communicates with a smart doorbell or other smart device to alert the user of the presence of an individual at their door. Accordingly, the present disclosure makes specific reference thereto. Nonetheless, it is to be appreciated that aspects of the present invention are also equally applicable to other like applications, devices, and methods of manufacture.

BACKGROUND

Individuals at a door may choose to knock on a door instead of using the doorbell. As a result, individuals within a home may not hear a knock on the door if they are in a specific area of the home. In addition, some homes lack doorbells and/or functioning doorbells. In addition, some individuals may wish to be notified when an individual approaches their door instead of waiting until said the individual knocks on their door.

Therefore, there exists a long-felt need in the art for an improved door notification device. There also exists a long-felt need in the art for a doormat device that alerts a homeowner that someone is at their doorstep. More specifically, there exists a long-felt need in the art for a doormat device that alerts a homeowner that someone is at their doorstep without requiring the owner to hear the individual knocking on their door. In addition, there also exists a long-felt need in the art for a doormat device that alerts a homeowner when an individual is approaching their door.

The subject matter disclosed and claimed herein, in one embodiment thereof, comprises a doormat device. The device is primarily comprised of a body with at least one battery, at least one transmitter, at least one pressure sensor, and/or at least one proximity sensor. In one embodiment, the device is comprised of a pressure sensor that is activated when a user steps on the device. Once the pressure sensor is activated, the transmitter of the device may communicate with a smart doorbell or other smart device to alert the user of the presence of an individual at their door. A second embodiment of the device is comprised of a proximity sensor that detects an individual approaching a door. Once the proximity sensor is activated, the transmitter of the device may communicate with a smart doorbell or other smart device to alert the user of the presence of an individual at their door.

In this manner, the doormat device of the present invention accomplishes all the foregoing objectives and provides a doormat device that alerts a homeowner that someone is at their doorstep without requiring the owner to hear the individual knocking on their door. In addition, the device alerts a homeowner when an individual is approaching their door.

SUMMARY

The following presents a simplified summary to provide a basic understanding of some aspects of the disclosed innovation. This summary is not an extensive overview, and it is not intended to identify key/critical elements or to delineate the scope thereof. Its sole purpose is to present some general concepts in a simplified form as a prelude to the more detailed description that is presented later.

The subject matter disclosed and claimed herein, in one embodiment thereof, comprises a doormat device primarily comprised of a body with at least one battery, at least one transmitter, at least one pressure sensor, and/or at least one proximity sensor. The body of the device is preferably rectangular in shape. The bottom surface of the body may be comprised of a non-slip material that prevents the body from moving when it is stepped on.

In one embodiment, the body is comprised of at least one pressure sensor. The pressure sensor may be embedded within the top surface or any other portion of the body. The pressure sensor may be comprised of a threshold weight that prevents erroneous activations of the pressure sensor by non-humans who step on the device. When a human steps on the device and the threshold weight of the pressure sensor has been exceeded, the pressure sensor communicates with at least one transmitter that is in wired or wireless (i.e., Bluetooth, Wi-Fi, etc.) communication with a receiver of a secondary device such as, but not limited to, a mobile phone, a tablet, other smart device, and/or a smart doorbell. In this manner, activation of the pressure sensor will produce an alert on the secondary device.

In another embodiment, the body is alternatively and/or comprised of at least one proximity sensor that is preferably embedded in at least one side surface of the body. The proximity sensor may have any amount of field of view between 0 and 180 degrees and is preferably comprised of a threshold distance wherein the sensor only detects a moving human within the threshold distance. Once the sensor has detected a human in proximity to the device within the threshold distance, the sensor communicates with at least one transmitter of the device that is in wired or wireless (i.e., Bluetooth, Wi-Fi, etc.) communication with a receiver of a secondary device such as, but not limited to, a mobile phone, a tablet, other smart device, and/or a smart doorbell. In this manner, the detection of an individual approaching the device via the sensor will produce an alert on the secondary device.

Accordingly, the doormat device of the present invention is particularly advantageous as it provides a doormat device that alerts a homeowner that someone is at their doorstep without requiring the owner to hear the individual knocking on their door. In addition, the device alerts a homeowner when an individual is approaching their door. In this manner, the doormat device allows a user to become aware of an individual at or approaching their doorstep.

To the accomplishment of the foregoing and related ends, certain illustrative aspects of the disclosed innovation are described herein in connection with the following description and the annexed drawings. These aspects are indicative, however, of but a few of the various ways in which the principles disclosed herein can be employed and are intended to include all such aspects and their equivalents. Other advantages and novel features will become apparent from the following detailed description when considered in conjunction with the drawings.

BRIEF DESCRIPTION OF THE DRAWINGS

The description refers to provided drawings in which similar reference characters refer to similar parts throughout the different views, and in which.

DETAILED DESCRIPTION

Figure 1:
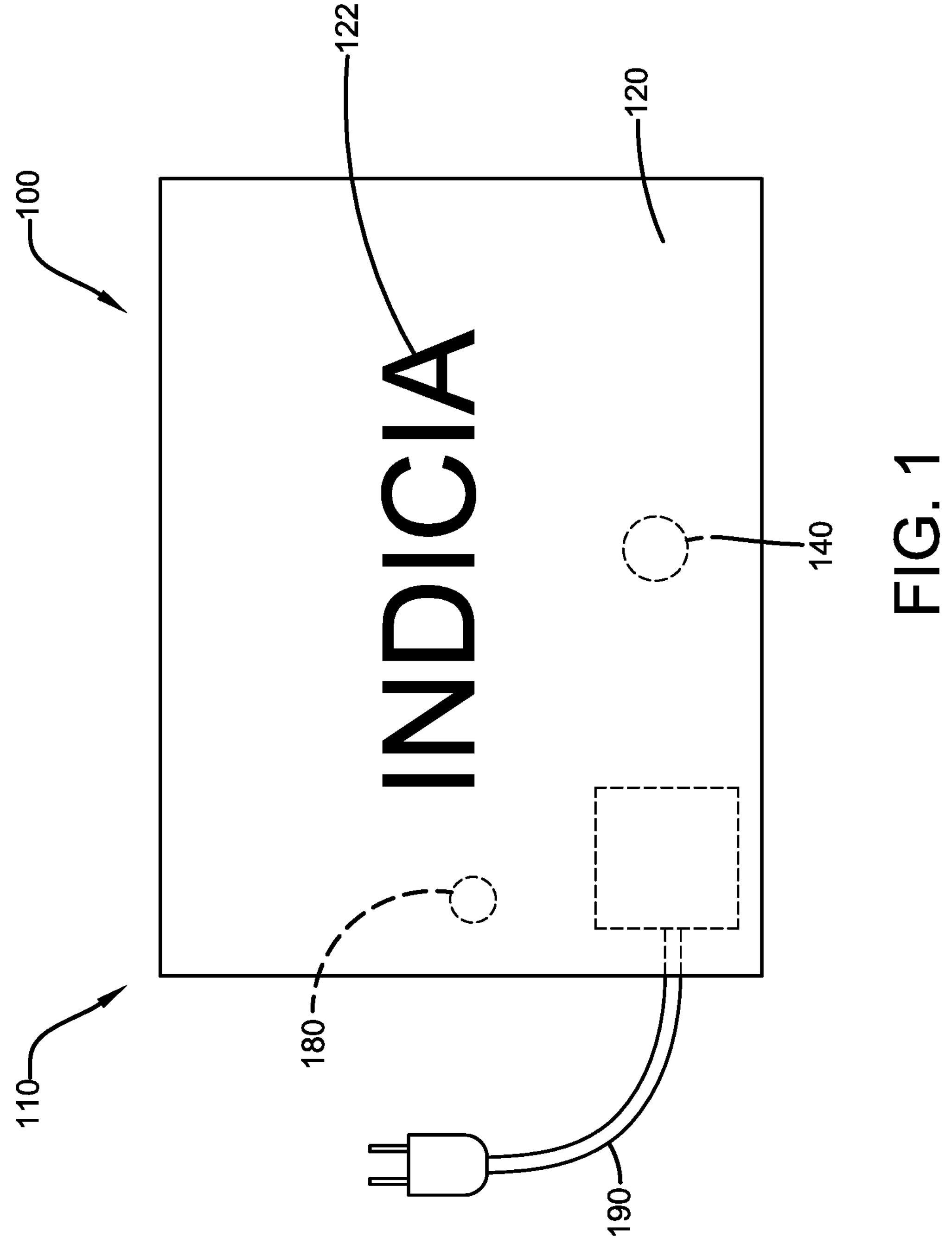
FIG. 1 illustrates a top view of one potential embodiment of a doormat device of the present invention in accordance with the disclosed architecture.

The innovation is now described with reference to the drawings, wherein like reference numerals are used to refer to like elements throughout. In the following description, for purposes of explanation, numerous specific details are set forth to provide a thorough understanding thereof. It may be evident, however, that the innovation can be practiced without these specific details. In other instances, well-known structures and devices are shown in block diagram form to facilitate a description thereof. Various embodiments are discussed hereinafter. It should be noted that the figures are described only to facilitate the description of the embodiments. They are not intended as an exhaustive description of the invention and do not limit the scope of the invention. Additionally, an illustrated embodiment need not have all the aspects or advantages shown. Thus, in other embodiments, any of the features described herein from different embodiments may be combined.

As noted above, there exists a long-felt need in the art for an improved door notification device. There also exists a long-felt need in the art for a doormat device that alerts a homeowner that someone is at their doorstep. More specifically, there exists a long-felt need in the art for a doormat device that alerts a homeowner that someone is at their doorstep without requiring the owner to hear the individual knocking on their door. In addition, there also exists a long-felt need in the art for a doormat device that alerts a homeowner when an individual is approaching their door.

The present invention, in one exemplary embodiment, is comprised of a doormat device. The device is primarily comprised of a body with at least one battery, at least one transmitter, at least one pressure sensor, and/or at least one proximity sensor. The body of the device is preferably rectangular in shape. The bottom surface of the body may be comprised of a non-slip material that prevents the body from moving when it is stepped on.

In one embodiment, the body is comprised of at least one pressure sensor that may be embedded within the top surface or any other portion of the body. The pressure sensor may be comprised of a threshold weight that prevents erroneous activations of the pressure sensor by non-humans who step on the device. When a human steps on the device and the threshold weight of the pressure sensor has been exceeded, the pressure sensor communicates with at least one transmitter that is in wired or wireless (i.e., Bluetooth, Wi-Fi, etc.) communication with a receiver of a secondary device such as, but not limited to, a mobile phone, a tablet, other smart device, and/or a smart doorbell. In this manner, activation of the pressure sensor will produce an alert on the secondary device.

In another embodiment, the body is alternatively and/or comprised of at least one proximity sensor that is preferably embedded in at least one side surface of the body. The proximity sensor may have any amount of field of view between 0 and 180 degrees. The sensor is preferably comprised of a threshold distance, wherein the sensor only detects a moving human within the threshold distance. Once the sensor has detected a human in proximity to the device within the threshold distance, the sensor communicates with at least one transmitter of the device that is in wired or wireless (i.e., Bluetooth, Wi-Fi, etc.) communication with a receiver of a secondary device such as, but not limited to, a mobile phone, a tablet, other smart device, and/or a smart doorbell. In this manner, the detection of an individual approaching the device via the sensor will produce an alert on the secondary device.

Accordingly, the doormat device of the present invention is particularly advantageous as it provides a doormat device that alerts a homeowner that someone is at their doorstep without requiring the owner to hear the individual knocking on their door. In addition, the device alerts a homeowner when an individual is approaching their door. In this manner, the doormat device allows a user to become aware of an individual at or approaching their doorstep.

Referring initially to the drawings, FIG. 1 illustrates a top view of one potential embodiment of a doormat device 100 of the present invention in accordance with the disclosed architecture. The device 100 is primarily comprised of a body 110 with at least one battery 160, at least one transmitter 180, at least one pressure sensor 140, and/or at least one proximity sensor 150. The body 110 of the device 100 is preferably rectangular in shape. However, the body 110 may be any shape known in the art in different embodiments. This includes the body 110 having the shape of any item, object, product, logo, symbol, brand, character, person, icon, etc., known in the art.

The body 110 may be made from a plurality of materials. The body 110 may be made of any combination of (but not limited to) nylon, polypropylene, coir, cotton, microfiber, natural rubber, natural grasses, natural material, synthetic material, etc. The top surface 120 (and or any other area of the body 110) may be comprised of at least one indicia 122 such as, but not limited to, patterns, logos, emblems, images, symbols, designs, letters, numbers, words, characters, animals, advertisements, brands, etc.

The bottom surface 130 of the body 110 may be comprised of a non-slip material. This prevents the body 110 from moving when it is stepped on. The non-slip bottom surface 130 may be textured with a recessed or raised texture or may be non-textured. The non-slip material may be made from materials such as, but not limited to, silicone, latex, neoprene, EPDM, PVC foam, polyethylene, sponge rubber, silicone foam, urethane, cork, ridged and/or recessed rubber, felt, acrylic, polyester & SBR, etc.

In one embodiment, the body 110 is comprised of at least one pressure sensor 140. The pressure sensor 140 may be any type known in the art. The pressure sensor 140 may be embedded within the top surface 120 or any other portion of the body 110. The pressure sensor 140 may be comprised of a threshold weight. The threshold weight may be any weight but is preferably at least 30 pounds. This prevents erroneous activations of the pressure sensor 140 by non-humans who step on the device 100.

When a human steps on the device 100 and the threshold weight of the pressure sensor 140 has been exceeded, the pressure sensor 140 communicates with at least one transmitter 180 of the device 100. The sensor 140 may be in wired or wireless communication with the transmitter 180. The transmitter 180 is in wired or wireless (i.e., Bluetooth, Wi-Fi, etc.) communication with a receiver 202 of a secondary device 200 such as, but not limited to, a mobile phone, a tablet, other smart device, and/or a smart doorbell. In this manner, activation of the pressure sensor 140 will produce an alert on the secondary device 200. In one embodiment, the alert is configured to alert a deaf individual using deaf alert systems known in the art. In another embodiment, the secondary device 200 may be a two-way speaker.

Figure 2:
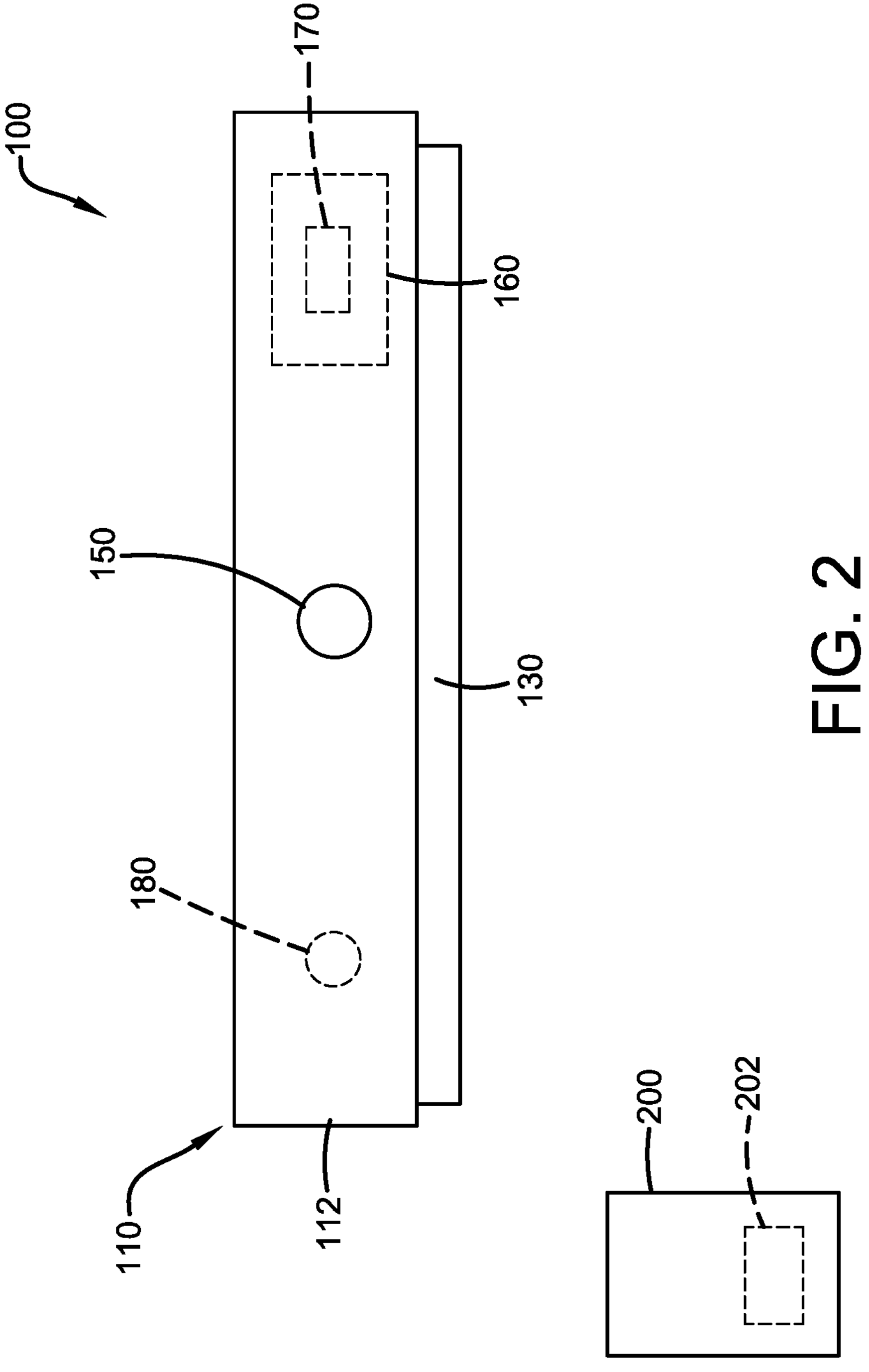
FIG. 2 illustrates a top view of one potential embodiment of a doormat device of the present invention in accordance with the disclosed architecture.

In another embodiment, the body 110 is alternatively and/or comprised of at least one proximity sensor 150, as seen in FIG. 2. The proximity sensor 150 may be any type known in the art, including, but not limited to, a laser proximity sensor. The proximity sensor 150 is preferably embedded in at least one side surface 112 of the body 110. The proximity sensor 150 may have any amount of field of view between 0 and 180 degrees. The sensor 150 is comprised of a threshold distance such as, but not limited to, 15 feet, wherein the sensor 150 only detects a moving human within the threshold distance. This prevents erroneous alerts from the sensor 150. In one embodiment, the sensor 150 is also comprised of a motion sensor and/or motion-sensing features.

Once the sensor 150 has detected a human in proximity to the device 100 within the threshold distance, the sensor 150 communicates with at least one transmitter 180 of the device 100. The sensor 150 may be in wired or wireless communication with the transmitter 180. The transmitter 180 is in wired or wireless (i.e., Bluetooth, Wi-Fi, etc.) communication with a receiver 202 of a secondary device 200 such as, but not limited to, a mobile phone, a tablet, other smart device, and/or a smart doorbell. In this manner, the detection of an individual approaching the device 100 via the sensor 150 will produce an alert on the secondary device 200. In one embodiment, the alert is configured to alert a deaf individual using deaf alert systems known in the art. In another embodiment, the secondary device 200 may be a two-way speaker.

Both sensors 140,150 and the transmitter 180 are powered by at least one battery 160. The battery 160 may be a disposable battery 160 or a rechargeable battery 160 in the form of an alkaline, nickel-cadmium, nickel-metal hydride battery 160, etc., such as any 3V-12 volts DC battery 160 or other conventional battery 160 such as A, AA, AAA, etc., that supplies power to the device 100. Throughout this specification the terms "battery" and "batteries" may be used interchangeably to refer to one or more wet or dry cells or batteries 160 of cells in which chemical energy is converted into electricity and used as a source of DC power. References to recharging or replacing batteries 160 may refer to recharging or replacing individual cells, individual batteries 160 of cells, or a package of multiple battery cells as is appropriate for any given battery 160 technology that may be used. Additionally, the battery 160 may be recharged by a charging port 170 of any USB type or other charging port type known in the art. In another embodiment, the battery 160 is powered via at least one power cord 190 that can be preferably plugged into a 110 v/240 v female outlet.

It should be appreciated that the device 100 can be used in any residential or commercial application.

Certain terms are used throughout the following description and claims to refer to particular features or components. As one skilled in the art will appreciate, different persons may refer to the same feature or component by different names. This document does not intend to distinguish between components or features that differ in name but not structure or function. As used herein "doormat device" and "device" are interchangeable and refer to the doormat device 100 of the present invention.

Notwithstanding the foregoing, the doormat device 100 of the present invention and its various components can be of any suitable size and configuration as is known in the art without affecting the overall concept of the invention, provided that they accomplish the above-stated objectives. One of ordinary skill in the art will appreciate that the size, configuration, and material of the doormat device 100 as shown in the FIGS. are for illustrative purposes only, and that many other sizes and shapes of the doormat device 100 are well within the scope of the present disclosure. Although the dimensions of the doormat device 100 are important design parameters for user convenience, the doormat device 100 may be of any size, shape, and/or configuration that ensures optimal performance during use and/or that suits the user's needs and/or preferences.

Various modifications and additions can be made to the exemplary embodiments discussed without departing from the scope of the present invention. While the embodiments described above refer to particular features, the scope of this invention also includes embodiments having different combinations of features and embodiments that do not include all the described features. Accordingly, the scope of the present invention is intended to embrace all such alternatives, modifications, and variations as fall within the scope of the claims, together with all equivalents thereof.

What has been described above includes examples of the claimed subject matter. It is, of course, not possible to describe every conceivable combination of components or methodologies for purposes of describing the claimed subject matter, but one of ordinary skill in the art may recognize that many further combinations and permutations of the claimed subject matter are possible. Accordingly, the claimed subject matter is intended to embrace all such alterations, modifications, and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A doormat device comprising:

a body comprising a top surface and a recessed textured sponge rubber bottom surface;

a pressure sensor embedded within the top surface of the body;

a proximity sensor;

a transmitter in electrical communication with the pressure sensor and configured to wirelessly send an alert to at least two secondary devices once a threshold weight of at least 30 pounds is detected by the pressure sensor;

the transmitter in electrical communication with the proximity sensor and configured to wirelessly send the alert to the at least two secondary devices once movement is detected within a threshold distance of the proximity sensor;

wherein at least one of the at least two secondary devices is selected from a remote group relative to the doormat device consisting of a mobile phone and a tablet;

wherein at least another of the at least two secondary devices is selected from a proximal group relative to the doormat device consisting of a smart doorbell and a two-way speaker;

wherein the alert is transmitted to the at least two secondary devices when the threshold weight is detected by the pressure sensor or when movement is detected within the threshold distance by the proximity sensor to alert a user of the presence of another individual;

wherein the transmitter is in electrical communication with a respective receiver of the at least two secondary devices;

wherein the alert is initiated when the movement of the individual approaches the doormat device or when the individual steps on the doormat device;

a battery in electrical communication with the pressure sensor and the transmitter; and wherein the proximity sensor has a field of view between 0 and 180 degrees.

2. The doormat device of claim 1, wherein the body is comprised of a nylon, a polypropylene, a coir, a cotton, a microfiber, a natural rubber, or a natural grass.

3. A doormat device comprising:

a body comprising a top surface and a cork bottom surface;

a pressure sensor embedded within the body;

a laser proximity sensor embedded within a side surface of the body;

a transmitter in wireless electrical communication with the pressure sensor and configured to wirelessly send an alert to at least two secondary devices once a threshold weight is detected by the pressure sensor;

the transmitter in wireless electrical communication with the laser proximity sensor and configured to wirelessly send the alert to the at least two secondary devices once movement is detected within a threshold distance of the laser proximity sensor;

wherein at least one of the at least two secondary devices is selected from a remote group relative to the doormat device consisting of a mobile phone and a tablet;

wherein at least another of the at least two secondary devices is selected from a proximal group relative to the doormat device consisting of a smart doorbell and a two-way speaker;

wherein the alert is transmitted to the at least two secondary devices when the threshold weight is detected by the pressure sensor or when movement is detected within the threshold distance by the laser proximity sensor to alert a user of the presence of another individual;

wherein the transmitter is in electrical communication with a respective receiver of the at least two secondary devices;

wherein the alert is initiated when the movement of the individual approaches the doormat device or when the individual steps on the doormat device;

a battery in electrical communication with the laser proximity sensor and the transmitter;

wherein the body is logo shaped body; and wherein the laser proximity sensor has a field of view between 0 and 180 degrees.

4. A doormat device comprising:

a body comprising a top surface and a ridged rubber bottom surface;

a pressure sensor embedded within the top surface of the body;

a laser proximity sensor embedded within a side surface of the body;

a transmitter in electrical communication with the pressure sensor and the laser proximity sensor and configured to send an alert to at least two secondary devices once a threshold weight of at least 30 pounds is detected by the pressure sensor or once a movement is detected within 15 feet of the doormat device by the laser proximity sensor;

wherein at least one of the at least two secondary devices is selected from a remote group relative to the doormat device consisting of a mobile phone and a tablet;

wherein at least another of the at least two secondary devices is selected from a proximal group relative to the doormat device consisting of a smart doorbell and a two-way speaker;

wherein the alert is transmitted to the at least two secondary devices when the threshold weight is detected by the pressure sensor or when movement is detected within 15 feet of the doormat device by the laser proximity sensor to alert a user of the presence of another individual;

wherein the transmitter is in electrical communication with a respective receiver of the at least two secondary devices;

a battery comprised of a charging port positioned within the body and in electrical communication with the pressure sensor, the laser proximity sensor, and the transmitter; and wherein the body is an icon shaped body; and wherein the laser proximity sensor has a field of view between 0 and 180 degrees.

5. The doormat device of claim 4, wherein the charging port is comprised of a USB port.

* * * * *